United States Patent
Jeon

(10) Patent No.: US 7,851,341 B2
(45) Date of Patent: Dec. 14, 2010

(54) SEMICONDUCTOR DEVICE AND METHOD FOR MANUFACTURING THE SAME

(75) Inventor: Dong Ki Jeon, Icheon-si (KR)

(73) Assignee: Dongbu Hitek Co., Ltd., Seoul (KR)

(*) Notice: Subject to any disclaimer, the term of this patent is extended or adjusted under 35 U.S.C. 154(b) by 527 days.

(21) Appl. No.: 11/844,016

(22) Filed: Aug. 23, 2007

(65) Prior Publication Data

US 2008/0048276 A1 Feb. 28, 2008

(30) Foreign Application Priority Data

Aug. 24, 2006 (KR) .................. 10-2006-0080543

(51) Int. Cl.
*H01L 21/00* (2006.01)
(52) U.S. Cl. .................................... 438/592
(58) Field of Classification Search ........... 438/592, 438/643, 653
See application file for complete search history.

(56) References Cited

U.S. PATENT DOCUMENTS

| 5,376,405 | A  | * | 12/1994 | Doan et al. ............. 438/680 |
| 5,902,129 | A  | * | 5/1999  | Yoshikawa et al. ....... 438/592 |
| 6,596,643 | B2 | * | 7/2003  | Chen et al. ............. 438/706 |
| 6,936,535 | B2 | * | 8/2005  | Kim et al. .............. 438/656 |
| 2006/0079087 | A1 | * | 4/2006 | Kawamura et al. ........ 438/664 |

FOREIGN PATENT DOCUMENTS

JP 2004-299280 4/2006

* cited by examiner

*Primary Examiner*—Richard A. Booth
(74) *Attorney, Agent, or Firm*—Saliwanchik, Lloyd & Saliwanchik

(57) ABSTRACT

A semiconductor device is provided including a transistor element on a substrate, a silicide on a gate and a source/drain of the transistor element; and an amorphous capping layer on the silicide.

10 Claims, 6 Drawing Sheets

SEMICONDUCTOR DEVICE AND METHOD FOR MANUFACTURING THE SAME

CROSS-REFERENCE TO RELATED APPLICATION

The present application claims the benefit under 35 U.S.C. §119 of Korean Patent Application No. 10-2006-0080543, filed Aug. 24, 2006, which is hereby incorporated by reference in its entirety.

BACKGROUND

In forming a semiconductor device, as a method for forming an ohmic contact between a gate electrode and source/drain and a metal line, silicide by means of a combination of a metal and a compound of silicon is used.

Currently, the material commonly applied to a device in 0.18 μm technology and below is cobalt (Co). Here, cobalt is combined in a $CoSi_2$ form that shows a relatively low silicide resistance Rsh and a good RC operation of the ohmic contact between the metal and the gate and the source/drain.

Generally, the process of forming $CoSi_2$ includes performing a cobalt deposition, forming a capping layer of TiN on the deposited cobalt and then subjecting the wafer to a rapid thermal processing (RTP).

Herein, the reason why the capping TiN is used is because Co is very easily oxidized in the air, so that if material of the substrate not directly reacted with Co is capped, oxidation is prevented and silicide is thus well formed.

However, in the related art, the capping TiN layer material uses crystalline TiN material deposited by a physical vapor deposition (PVD).

However, the crystalline TiN has a columnar structure so that air is diffused according to the columnar structure and is able to oxidize the Co. The oxidized Co may cause a defect in the device by not exhibiting a normal silicide operation.

BRIEF SUMMARY

Embodiments of the present invention provide a semiconductor device and a method for manufacturing the same capable of inhibiting a metal layer for silicide from being oxidized by applying an amorphous structure to a capping layer instead of the existing crystalline structure making it possible to reduce a defect of the device.

A semiconductor device according to an embodiment includes: a gate insulating layer, a gate, a source/drain, and a spacer formed on a substrate; silicide on the gate and the source/drain; and an amorphous capping layer on the silicide.

Also, a method for manufacturing a semiconductor device according to an embodiment includes: forming a metal layer for silicide on a substrate provided with a gate insulating layer, a gate, and a source/drain; forming an amorphous capping layer on the metal layer; forming silicide by performing a first annealing on the substrate including the metal layer for silicide and the capping layer; and removing the metal layer not reacted as silicide.

DETAILED DESCRIPTION

Hereinafter, an image sensor and a method for manufacturing the same according to embodiments of the present invention will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
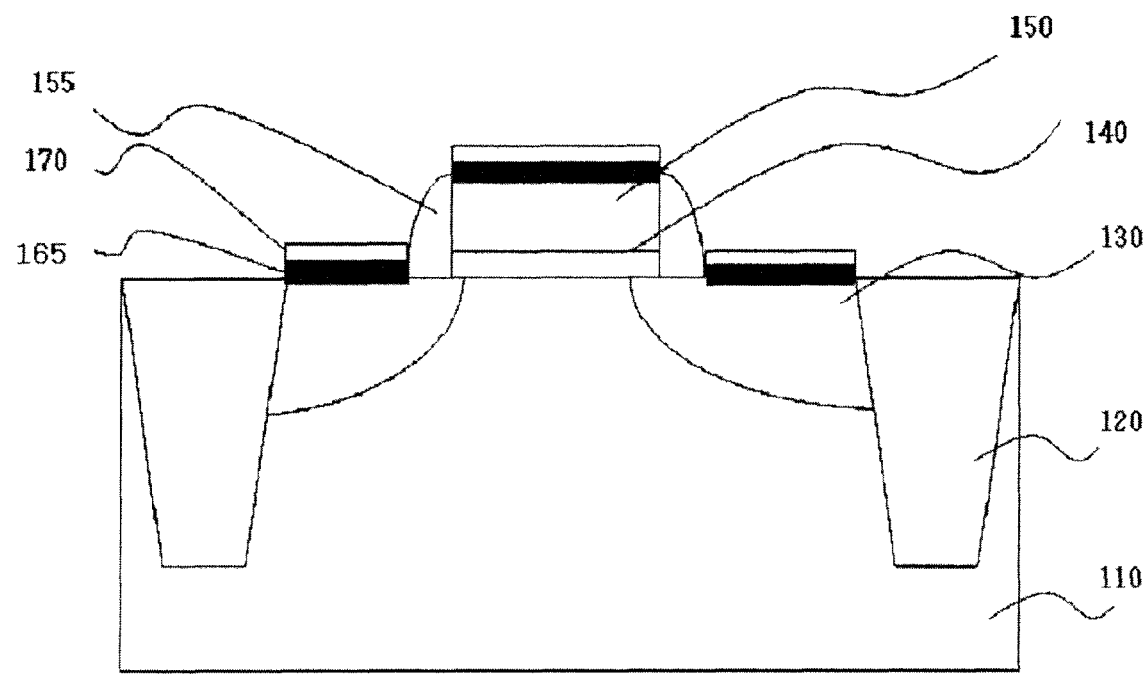
FIG. 1 is a cross-sectional view of a semiconductor device according to an embodiment of the present invention.

FIG. 1 is a cross-sectional view of a semiconductor device according to a first embodiment.

Referring to FIG. 1, a semiconductor device can include a gate insulating layer 140, a gate 150, a source/drain 130, and a spacer 155 formed on a substrate 110. A silicide 165 can be formed on the gate and the source/drain, and an amorphous capping layer 170 can be provided on the silicide.

An active region can be defined in the substrate 110 by means of a device isolating layer 120. The spacer 155 can be formed at sidewalls of a gate electrode configured of the gate insulating layer 140 and the gate 150.

The silicide 165 can be, for example, cobalt silicide ($CoSi_2$), titanium silicide ($TiSi_2$), or platinum silicide (PtSi, $Pt_2Si$).

In one embodiment, cobalt silicide ($CoSi_2$) is used as the silicide material. The cobalt silicide ($CoSi_2$) can be formed by combining cobalt (Co), which is a group VIII metal, with silicon. $CoSi_2$ has a smaller specific resistance as compared to molybdenum silicide (MoSi) and tantalum silicide $TaSi_2$ with a high melting point so that it has good characteristics as a contacting material.

The amorphous capping layer 170 can be, for example, amorphous TiN, amorphous Ti, amorphous Ti/N, amorphous TiW, amorphous Ta, and amorphous TaN.

In one embodiment, amorphous TiN is used as the capping layer 170. The amorphous TiN can be formed by pyrolyzing and depositing a tetrakis dimethyl amino titanium (TDMAT) source. The amorphous TiN serves as a better capping layer compared to the crystalline TiN formed in a PVD manner of the related art, and can substantially block external air by efficiently blocking the oxidation of the metal layer for silicide.

The amorphous capping layer 170 can be formed at a thickness of 50 Å or more. When the amorphous capping layer is at least 50 Å, it can reduce the oxidation of the metal layer for silicide by substantially blocking the external air.

With the semiconductor device according to embodiments of the present invention, the amorphous capping layer inhibits the oxidation of the metal for silicide. Also, the oxidation of the capping layer can be inhibited which has effects capable of improving the yield of the semiconductor device and improving the reliability of the semiconductor device.

FIGS. 2 to 6 are cross-sectional views of a manufacturing process of a semiconductor device according to the first embodiment.

Figure 2:
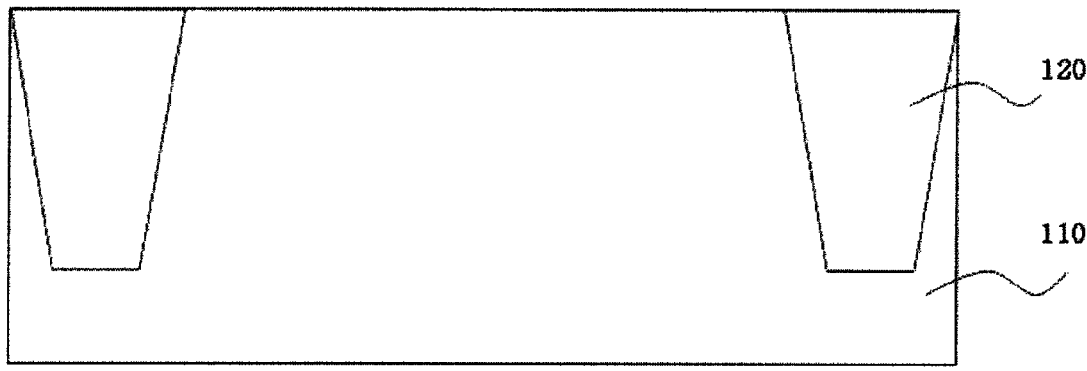
FIGS. 2 to 6 are cross-sectional views of a manufacturing process of a semiconductor device according to an embodiment of the present invention.

Referring to FIG. 2, an active region can be defined on a substrate 110 by means of a device isolating layer 120. The device isolating layer 120 can be formed by performing a LOCOS or a shallow trench isolation (STI). For example, in one embodiment the device isolating layer 120 is formed by means of the STI.

Figure 3:
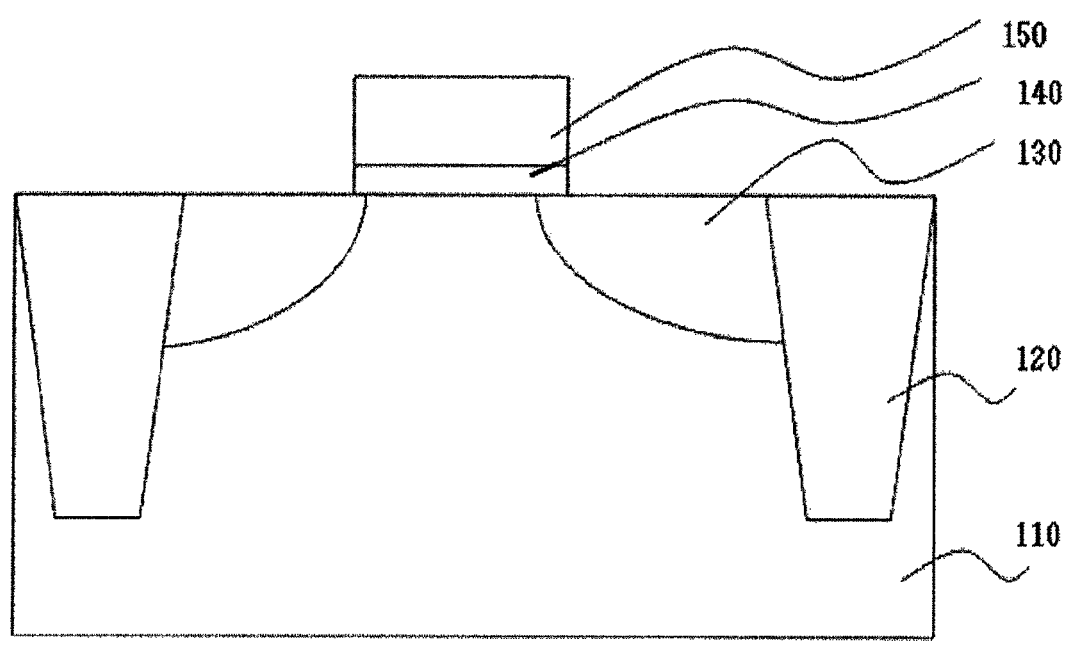

Next, referring to FIG. 3, a gate insulating layer 140 and a gate 150 can be formed on the active region of the substrate 110. A source/drain 130 can be formed by a predetermined ion implantation using, for example, the gate 150 as a mask.

Figure 4:
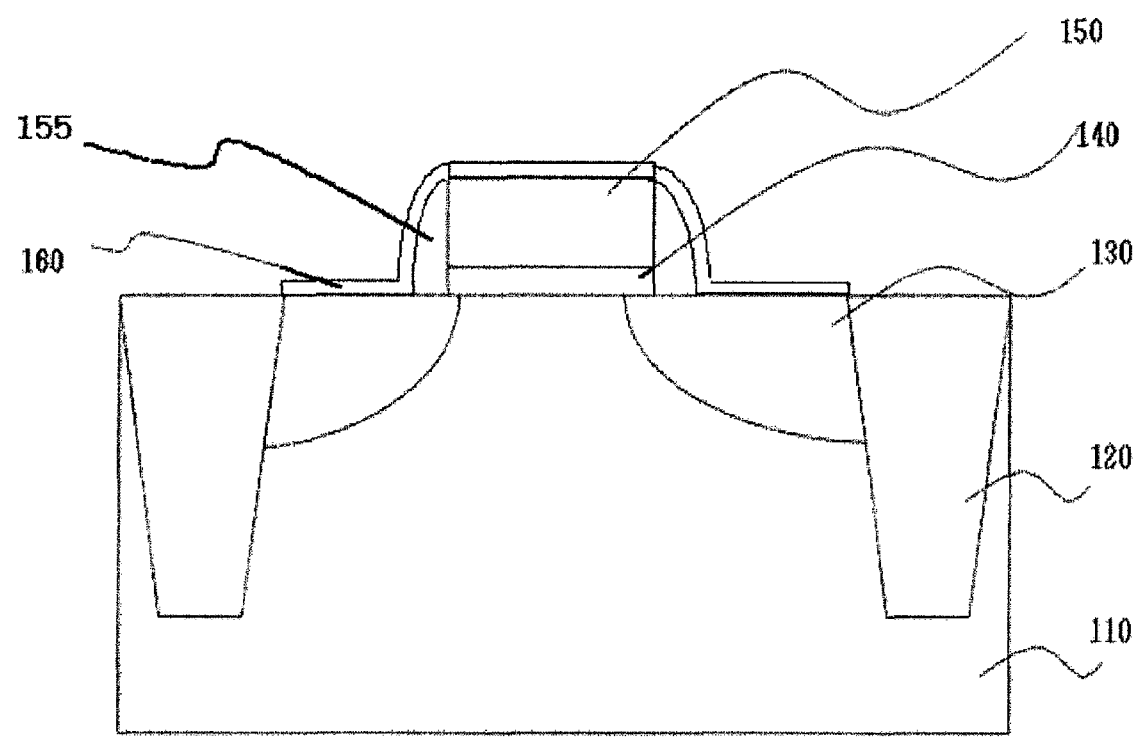

Referring to FIG. 4, a spacer 155 can be formed on the sidewalls of the gate 150. A second ion implantation process can be performed at this time in the source/drain 130 using the spacer 155 as a mask.

A metal layer 160 for silicide can be formed on the substrate 110 including the spacer 155.

The metal layer 160 can include, for example, cobalt (Co), titanium (Ti), or platinum (Pt).

In one embodiment, the metal layer 160 is cobalt (Co). The Co combines with silicon to form cobalt silicide ($CoSi_2$), and has a smaller specific resistance compared to molybdenum silicide (MoSi) and tantalum silicide ($TaSi_2$) with a high melting point so that it has good characteristics as a contacting material.

Figure 5:
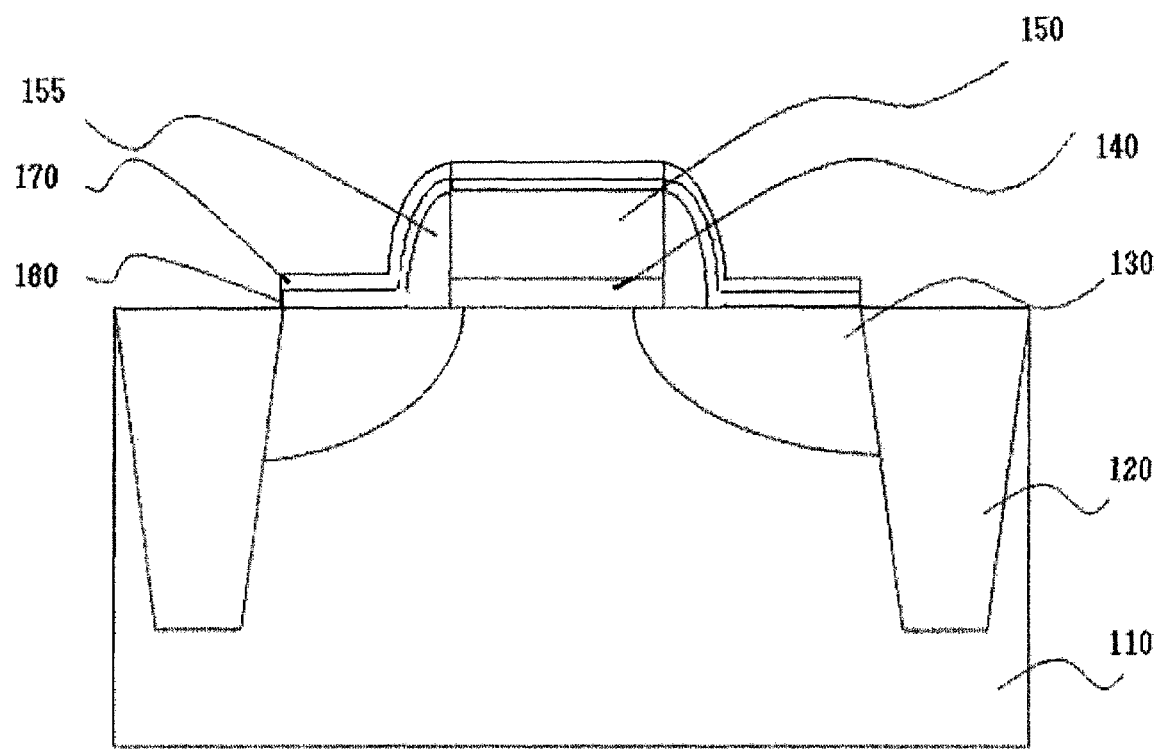

Next, referring to FIG. 5, an amorphous capping layer 170 can be formed on the metal layer for silicide 160.

The amorphous capping layer 170 can be, for example, amorphous TiN, amorphous Ti, amorphous Ti/N, amorphous TiW, amorphous Ta, or amorphous TaN.

In one embodiment, the amorphous capping layer 170 is amorphous TiN. The amorphous TiN can be formed by pyrolyzing and depositing tetrakis dimethyl amino titanium (TDMAT) source.

In an embodiment, the TDMAT pyrolysis can be performed in a CVD chamber. In other words, in an embodiment, the pyrolyzed TDMAT source deposits TiN on the substrate 110 in a CVD chamber so that an amorphous TiN can be obtained. The amorphous TiN efficiently blocks the external air so that it can inhibit the oxidation of the metal for silicide.

The pyrolysis of the TDMAT is preferably performed in the range of 300° C. to 500° C. for control of deposition.

The TDMAT can be carried in bubbler. In other words, the TDMAT can be carried into the CVD chamber in an inert gas, for example, a steam state by means of He gas.

In another embodiment, the TDMAT can be carried into the CVD chamber by a direct liquid injection method.

The amorphous capping layer 170 can be formed to a thickness of 50 Å or more. When the amorphous capping layer 170 is at least 50 Å, it can effectively reduce the oxidation of the metal layer for silicide by substantially blocking the external air.

Figure 6:
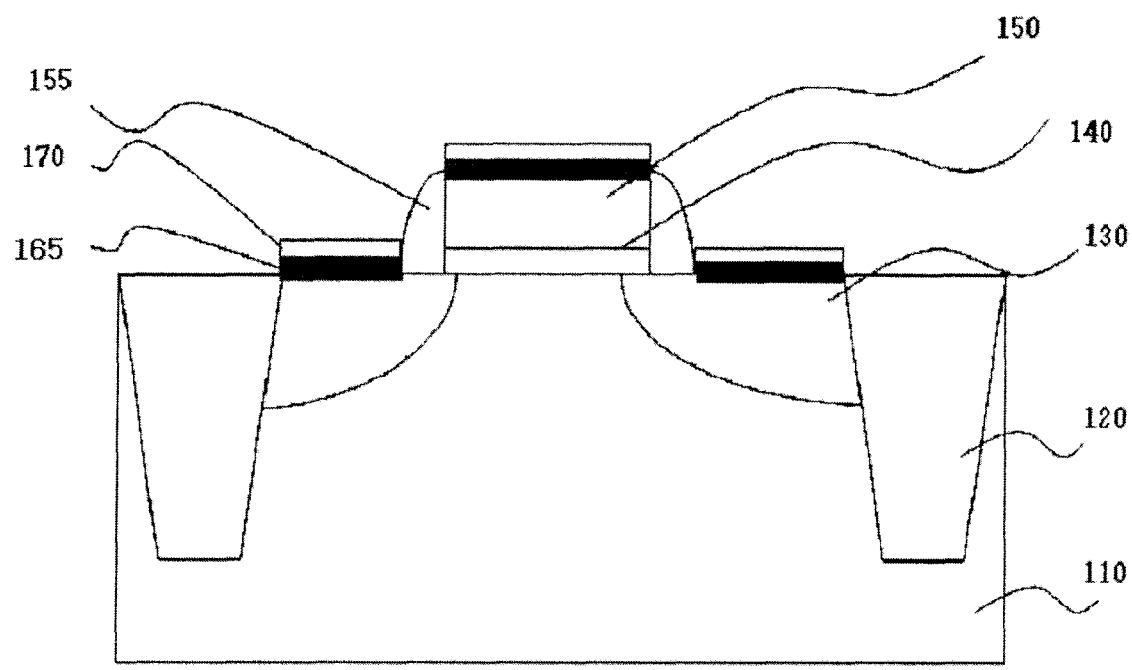

Next, referring to FIG. 6, silicide 165 can be formed by performing a first annealing process on the substrate 110 including the metal layer for silicide 160 and the capping layer 170. In a preferred embodiment, the first annealing is performed below 700° C. to inhibit reaction between the metal layer for silicide 160 and the spacer 155.

The silicide 165 can be, for example, cobalt silicide ($CoSi_2$), titanium silicide ($TiSi_2$), or platinum silicide (PtSi, $Pt_2Si$).

In one embodiment, cobalt silicide ($CoSi_2$) is the silicide material. Cobalt silicide ($CoSi_2$) is formed by the combination of Co and silicon, and has a smaller specific resistance compared to molybdenum silicide (MoSi) and tantalum silicide $TaSi_2$ with a high melting point so that it has good characteristics as a contacting material.

Subsequently, a portion of the metal layer 160 that did not react with the substrate 110 and the capping layer 170 on the non-reacted portion of the metal layer 160 are removed.

Next, in a further embodiment, a second annealing can be performed. The second annealing can be performed in Ar atmosphere at a temperature below 800° C. The temperature is selected to inhibit a problem where the element ion-implanted into the source/drain diffuses into the silicide 165 and increases the contact resistance.

With the semiconductor device according to the first embodiment, the amorphous capping layer inhibits the oxidation of the metal for silicide, having an effect capable of forming a suitable semiconductor device. Also, with the first embodiment, the oxidation of the capping layer can be inhibited, having the effects of improving the yield of the semiconductor device and improving the reliability of semiconductor device.

Figure 7:
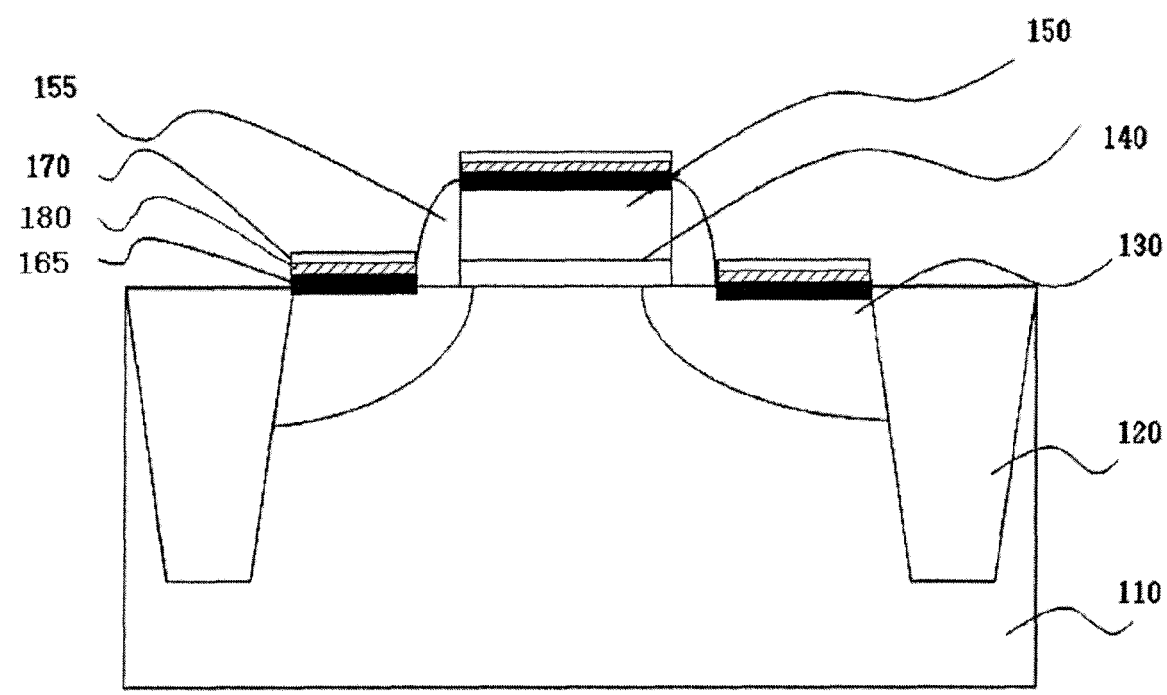
FIG. 7 is a cross-sectional view of a semiconductor device according to another embodiment of the present invention.

FIG. 7 is a cross-sectional view of a semiconductor device according to a second embodiment.

Referring to FIG. 7, a semiconductor device can include: a gate insulating layer 140, a gate 150, a source/drain 130, and a spacer 155 formed on a substrate 110. A silicide 165 can be formed on the gate and the source/drain, a Ti layer 180 can be provided on the silicide, and an amorphous capping layer 170 can be formed on the Ti layer 180.

The second embodiment can adopt the characteristics of the first embodiment and the manufacturing process thereof. However, the second embodiment is characterized by further comprising the Ti layer 180 between the metal layer for silicide 160 and the amorphous capping layer 170.

According to an embodiment, the amorphous capping layer 170 can be formed to a thickness of 15 to 25 Å, and the Ti layer 180 can be formed to a thickness of 25 Å to 35 Å. The Ti layer 180 can be rapidly grown by means of a PVD (physical vapor deposition). The amorphous capping layer 170 is formed on the Ti layer 180 so that the oxidation of the metal for silicide is efficiently reduced and the time for manufacturing process of the semiconductor is reduced, having an effect capable of simultaneously improving the yield of the semiconductor device and the performance thereof.

As described above, the semiconductor device and the method for manufacturing the same according to embodiments of the present invention inhibit the oxidation of the metal for silicide by means of the amorphous capping layer, having an effect capable of forming a suitable semiconductor device.

Also, with the embodiment, the oxidation of the capping layer can be inhibited, having effects capable of improving the yield of the device and improving the reliability thereof.

In addition, although the device may be left in the air for a long time after depositing the metal for silicide and the capping layer, an air diffusion does not occur therefrom, having an effect that the process operation such as a window time becomes easy.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, comprising:
   forming a metal layer for silicide on a substrate provided with a gate electrode and a source/drain;
   forming a Ti layer on the metal layer;
   forming an amorphous capping layer on the Ti layer;
   forming silicide by performing a first annealing on the substrate including the metal layer and the capping layer; and
   removing unreacted portions of the metal layer and the capping layer on the unreacted portions of the metal layer,
   wherein the Ti layer comprises a crystal structure,
   wherein the Ti layer is thicker than the amorphous capping layer.

2. The method according to claim 1, further comprising performing a second annealing after removing the unreacted portions of the metal layer and the capping layer on the unreacted portions of the metal layer.

3. The method according to claim 1, wherein the amorphous capping layer comprises amorphous TiN.

4. The method according to claim 3, wherein forming the amorphous capping layer comprises depositing the amorphous TiN by pyrolyzing tetrakis dimethyl amino titanium (TDMAT) source.

5. The method according to claim 4, wherein the TDMAT pyrolysis is performed in a CVD chamber.

6. The method according to claim 5, wherein the TDMAT is carried into the CVD by means of He gas.

7. The method according to claim 5, wherein the TDMAT is carried into the CVD chamber by means of a direct liquid injection method.

8. The method according to claim 4, wherein the TDMAT pyrolysis is performed at a temperature in the range of 300° C. to 500° C.

9. The method according to claim 1, wherein the amorphous capping layer is formed to a thickness of 15 to 25 Å.

10. The method according to claim 9, wherein the Ti layer is formed to a thickness of 25 to 35 Å.

* * * * *